United States Patent [19]
Wada

[11] Patent Number: 5,319,198
[45] Date of Patent: Jun. 7, 1994

[54] ELECTRON BEAM PROJECTION APPARATUS

[75] Inventor: Yasumitsu Wada, Tsurugashima, Japan

[73] Assignee: Pioneer Electronic Corporation, Tokyo, Japan

[21] Appl. No.: 982,964

[22] Filed: Nov. 30, 1992

[30] Foreign Application Priority Data

Dec. 3, 1991 [JP] Japan .................................. 3-319011

[51] Int. Cl.[5] .......................................... H01J 37/256
[52] U.S. Cl. ................... 250/310; 250/441.11; 250/396 R
[58] Field of Search ............... 250/310, 441.11, 396 R

[56] References Cited

U.S. PATENT DOCUMENTS

| | | | |
|---|---|---|---|
| 4,584,479 | 4/1986 | Lamattina et al. | 250/441.11 |
| 4,663,559 | 5/1987 | Christensen | 250/396 R |
| 5,103,102 | 4/1992 | Economou et al. | 250/441.11 |
| 5,122,663 | 6/1992 | Chang et al. | 250/310 |

*Primary Examiner*—Jack I. Berman
*Attorney, Agent, or Firm*—Sughrue, Mion, Zinn, Macpeak & Seas

[57] ABSTRACT

An electron beam projection apparatus including electron injection unit for irradiating an object with an electron beam. The electron injection unit includes a substrate, a cathode formed on the substrate for emitting the electrons, a control electrode formed on the substrate via an insulation layer in a manner enclosing the cathode for accelerating the electrons, and an anode formed on the control electrode via an insulation layer in a manner enclosing the cathode for converging the electron beam. The electron beam projection apparatus further including detecting unit formed on the anode via an insulation layer for detecting secondary electrons emitted from the object irradiated with the electron beam and differential pumping unit for producing a low vacuum condition in an space where the electron beam travels from the microscopic electron injection unit to the object. By maintaining a low vacuum condition, in the area where the electron beam is projected and detected, by using simple structural differential pumping unit, the detection accuracy can be achieved since the secondary electrons are amplified in the low vacuum area by the ionization of gas molecules.

8 Claims, 6 Drawing Sheets

ELECTRON BEAM PROJECTION APPARATUS

BACKGROUND OF THE INVENTION

1. Field of the Invention

This invention relates to a miniaturized electron beam projection apparatus which detects the state of an object, such as shape, thereof by irradiating the object with an electron beam.

2. Description of the Prior Art

A scanning electron microscope (SEM) is known as one type of electron beam projection apparatus whose schematic structure is shown in FIG. 1. In an electron optical unit of the apparatus shown in FIG. 1, fixed voltages are applied to the cathode 211, wehnelt 212 and anode 213 so that electrons are emitted from the cathode 211. The electrons emitted from the cathode 211 are adjusted in the traveling axis thereof by alignment coils 220, converged by focussing lens 221 and irradiate a sample in fixed position via a stigma coil 222, deflection coil 223 and objective lens 224. Then the scanning electron microscope detects secondary electrons generated from the sample with secondary electron detector 230. The stigma coil 222 adjusts for astigmatism and the deflection coil controls the direction of the electron beam. Also, the pumping system (not shown) connected to vents 250, 251 is provided in order to create a vacuum inside of the electron optical column.

In the scanning electron microscope, as described above, the internal air of electron optical column is evacuated via vents 250, 251 which produces a high vacuum condition therein. Under such a high vacuum condition, the electrons emitted from cathode 211 are condensed and projected against the sample 100 as an electron beam. When the electron beam thus projected is incident upon the surface of sample as primary electrons, secondary electrons are generated in response and then detected by secondary electron detector 230. From the secondary electrons thus obtained, the surface state of the sample is detected.

Since the scanning electron microscope is constructed as described above, it requires a large-scaled electron optical system having various types of lenses and coils for the electron optical system. Further, a pumping system and a substantial electron optical column are also required in order to maintain a high vacuum condition inside the entire large-scaled electron optical system, so that the cost becomes very high and the whole system becomes very large in size- and complex. Consequently, the use of the apparatus has been limited to research and development due to their large size and high cost.

SUMMARY OF THE INVENTION

It is an object of the present invention to provide an electron beam projection apparatus being totally miniaturized, lower-cost, and applicable for various uses.

According to one aspect of the present invention, there is provided an electron beam projection apparatus including electron injection unit for irradiating an object with an electron beam. The electron injection unit includes a substrate, a cathode formed on the substrate for emitting the electrons, a control electrode formed on the substrate via an insulation layer in a manner enclosing the cathode for accelerating the electrons, and an anode formed on the control electrode via an insulation layer in a manner enclosing the cathode for converging the electron beam. The electron beam projection apparatus further includes a detecting unit formed on the anode via an insulation layer for detecting secondary electrons emitted from the object irradiated with the electron beam and a differential pumping system for producing a low vacuum condition in a space where the electron beam travels from the microscopic electron injection unit to the object.

According to the present invention, it is possible to miniaturize microscopically the electron injection unit for injecting the electron beam by means of forming a lamination of the cathode, control electrodes, anode and the detection unit using a manufacturing process technology for producing semiconductor devices.

In addition, the detection accuracy can be achieved by maintaining a low vacuum condition in the area where the electron beam is injected and detected by using a simply-composed differential pumping system, since secondary electrons are amplified in the low vacuum area by the ionization of gas molecules.

DETAILED DESCRIPTION OF THE INVENTION

Preferred embodiments of the present invention are described below by taking an example of an election beam pickup for reproducing the information from a recording disc with reference to attached drawings.

Figure 1:
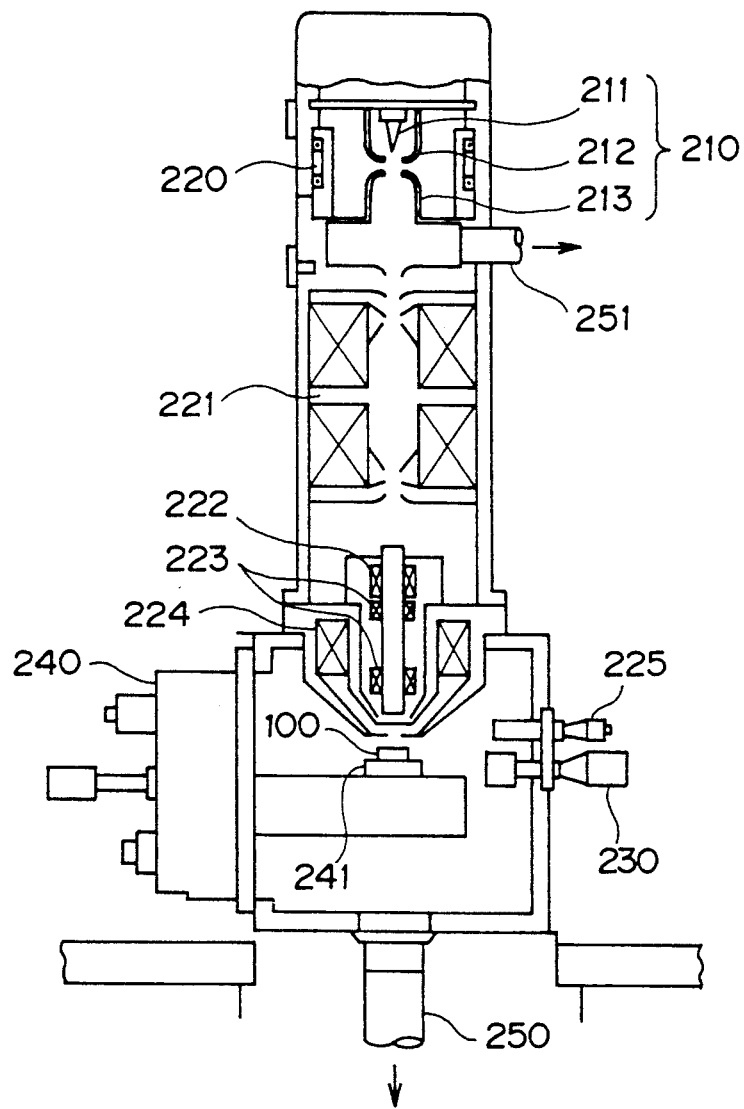
FIG. 1 is schematic illustration of an electron beam projection apparatus.
Figure 2:
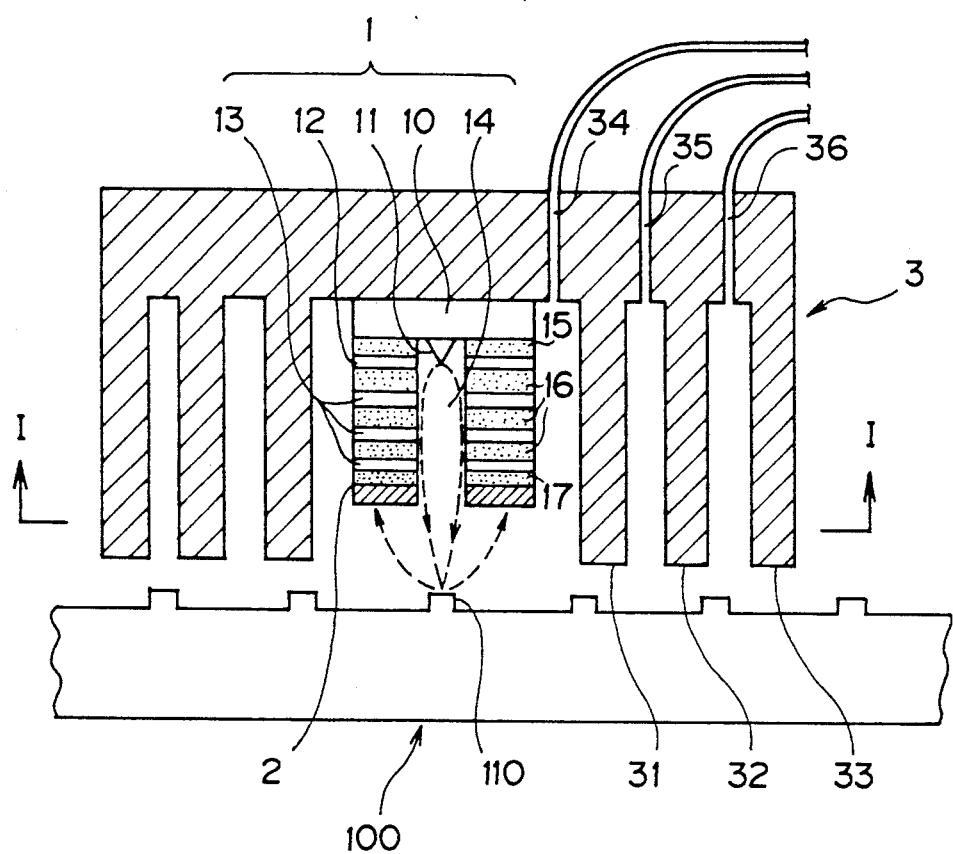
FIG. 2 is a longitudinal sectional view of an electron beam pickup according to an embodiment of the present invention.
Figure 3:
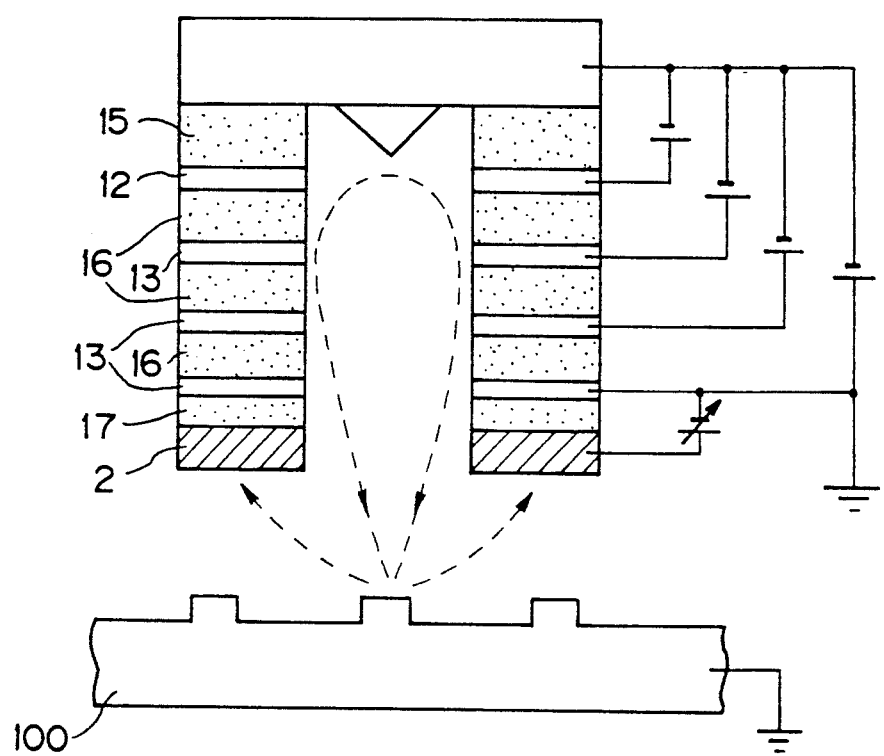
FIG. 3 is a longitudinal sectional view of a microscopic electron gun shown in FIG. 2.
Figure 4:
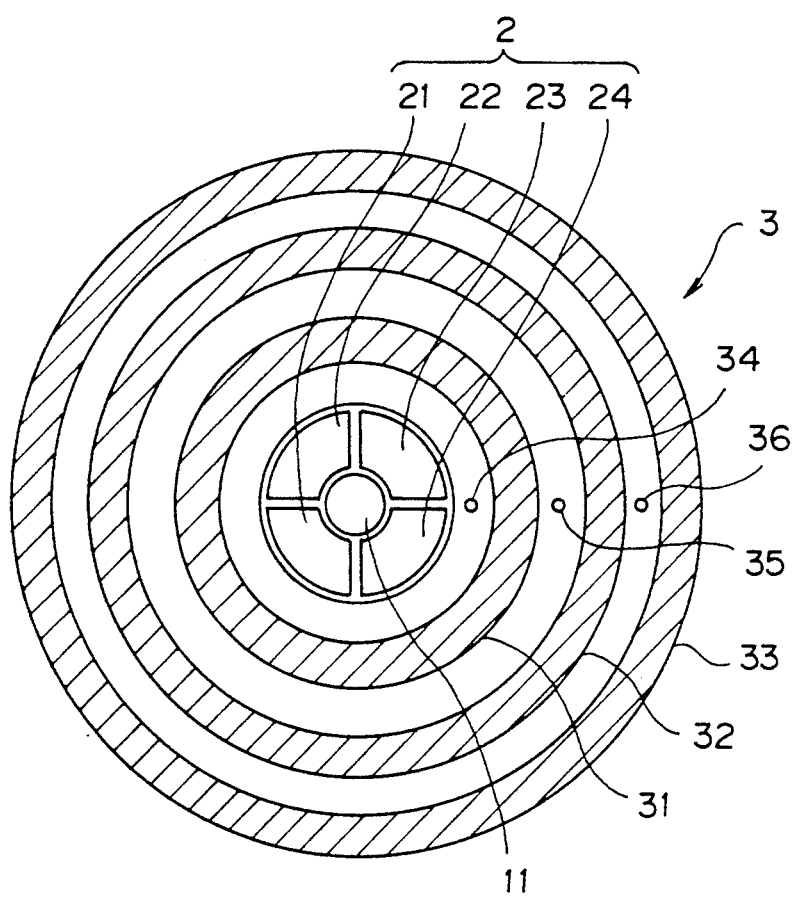
FIG. 4 is a transverse sectional view of an electron beam pickup corresponding to line IV—IV of FIG. 2.

FIG. 2 is a longitudinal sectional view of an electron beam projection apparatus according to the present invention, FIG. 3 is a longitudinal sectional view of a microscopic electron gun shown in FIG. 2, and FIG. 4 is a transverse sectional view corresponding to line IV—IV of FIG. 2. An electron beam projection apparatus includes microscopic electron gun 1, fabricated by a manufacturing process technology used to produce semiconductor devices, that projects the electron beam onto recording disc 100, detecting part 2 is arranged to enclose the injection muzzle 14 that injects the electron beam of this microscopic electron gun 1. The detecting part 2 detects the secondary electron beam emitted from the recording disc 100. The electron beam projection apparatus further includes differential pumping system 3 which produces a low vacuum condition for the space where the electron beam from the microscopic electron gun 1 travels to recording disc 100.

The microscopic electron gun 1 includes a cathode (emitter) 11 which emits electrons and is formed in a conical manner on a substrate 10, a gate (Wehnelt Cathode) 12 which is formed, via insulation layer 15, on the substrate 10 as a lamination in a ringed manner enclosing the cathode 11, and an anode 13 which is formed, via insulation layer 16, as a lamination on the gate 12 in a same manner as the gate 12 and operates as an electric lens system for converging the electron beam emitted from the cathode 11.

The detecting part 2 includes four-divided detectors 21–24, shown in FIG. 4, laminate-molded on the anode 13 via insulation layer 17, that detects the secondary electrons emitted from the recording disc 100 irradiated with the electron beam. The differential pumping system 3 includes protruding ringed walls 31–33 formed as concentric circles enclosing the microscopic electron gun 1, and vents 34–36 formed on the concave ditch part of the base of ringed walls 31–33 that are connected to the pumping apparatus which is not shown.

Next, the operation of the electron projecting apparatus will be described by taking the example of reading the information from the optional recording tracks 110 on the recording disc 100. In a case of reading information from the recording track 110, the electron projecting apparatus serves as an information pickup (hereinafter referred to as "electron beam pickup") for the target recording track 110, positioned under the electron beam, of the plurality of recording tracks on the recording disc 100. Above the recording track 110, the air in a space between electron beam pickup and recording disc 100 is evacuated through vents 34–36 respectively in order to produce a low vacuum condition therein. Under the low vacuum condition, the electrons are emitted from the cathode 11 by the electric field generated from the proper voltage applied to the cathode 11, the gate 12 and the anode 13. The emitted-electrons are accelerated by the gate 12, and then condensed into an electron beam and focused on the recording track 110 by the three-stage laminated anode 13. The spot diameter of this focussed electron beam is limited to be not more than 10 nm.

When the focused electron beam is incident as primary electrons on the surface of recording disc 100, the secondary electrons are emitted from the metal membrane of the surface of recording disc 100. By applying the electric field from recording disc 100 toward the side of the detector parts 2 as shown in FIG. 3, the electrons emitted are drawn out by the electric field and accelerated. In such case, if gas pressure and distance from the recording disc 100 are properly selected in a low vacuum condition, the emitted electrons incident upon the four-divided detectors 21–24 can be amplified by the ionization of gas molecules. The adjustment of the gas pressure is performed by the differential pumping system 3.

Other than the secondary electrons, the primary electrons reflected by the surface of recording disc 100 are also incident on the four-divided detectors 21–24. However, it is possible to control the ratio of primary electrons and secondary electrons incident on the four-divided detector 21–24 by controlling the electric field from recording disc 100 toward four-divided detector 2, because when the electric field of the detector side is reduced the secondary electrons incident on four-divided detectors 21–24 are correspondingly reduced. By this control, the information from the objective recording track 110 can be efficiently detected.

By calculating the different components of respective signals obtained from each of the four-divided detectors 21–24, edge information of the recording track 110 and tracking information on the recording track 110 are obtained. Further, RF signals of the recorded information are obtained by adding all of the detectable signals. In this way, the recording signal is reproduced from the recording disc 100 by properly controlling the gas pressure, distance from the surface, and the electric field at the detector side, etc.

Figure 5A:
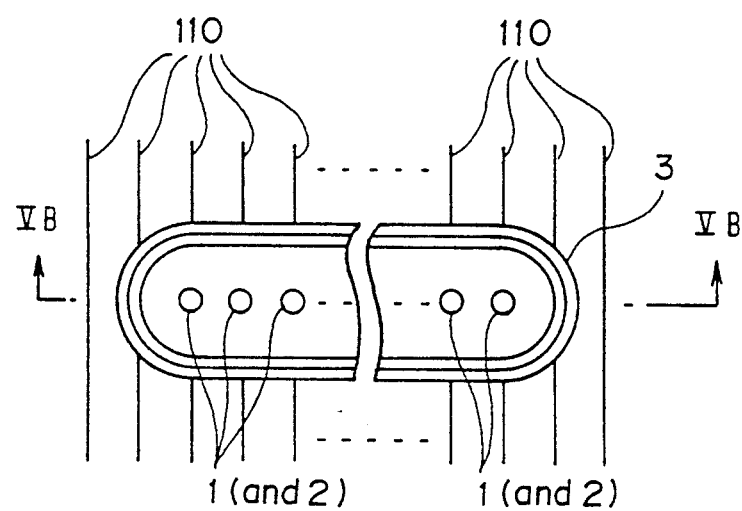
FIG. 5A is a plan view of an electron beam pickup according to the another embodiment of the present invention.
Figure 5B:
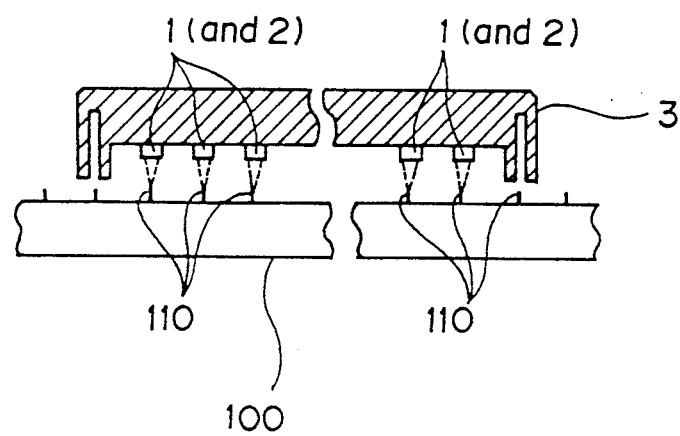
FIG. 5B is a cross-sectional view corresponding to line VB—VB of FIG. 4.

Although the above-described electron beam projecting apparatus has a single microscopic electron gun and four-divided detectors provided in single differential pumping system 3, it is possible to modify the composition to include a plurality of microscopic electron guns and four-divided detectors respectively, as shown in FIGS. 5A and 5B. In this case, it is possible to simultaneously examine (or reproduce) a plurality of positions on the surface of the objects with the four-divided detectors. Particularly, in the case of reproduction of the recording disc, a plurality of recording tracks can be efficiently read.

Figure 6A:
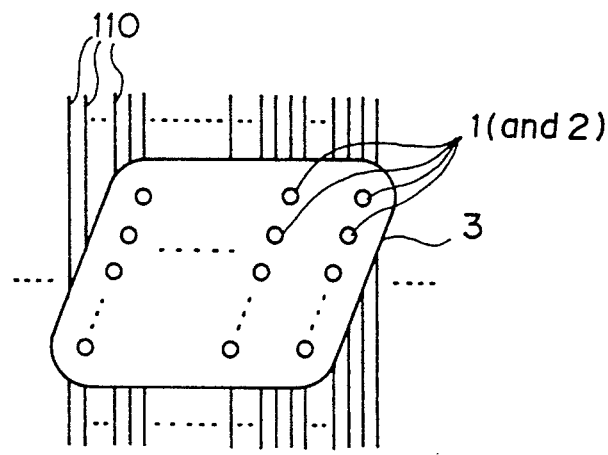
FIG. 6A, 6B and 6C are respective plan views of an electron beam pickups according to still other embodiments of the present invention.

Moreover, as illustrated in FIG. 6A, the present invention can be also arranged to include a plurality of microscopic electron guns and four-divided detectors oriented with respect to the radial direction of the recording track 110. By this inclined arrangement, the microscopic electron guns and four-divided detectors can be positioned to corresponds to tracks pitches between mutual recording track of the recording disc 100 recorded in high density.

Figure 6B:
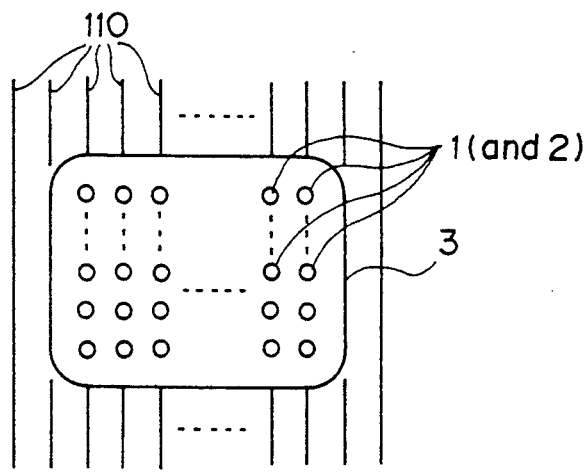

Moreover, in case of such an arrangement that a plurality of microscopical electron guns and four-divided detectors are provided in a aligned manner in a radial direction of the recording track 110 as illustrated in FIG. 6B, it is possible to detect the target with other detectors even though one of the detectors aligned becomes defective, resulting in the improvement of the yield in manufacturing apparatus.

Figure 6C:
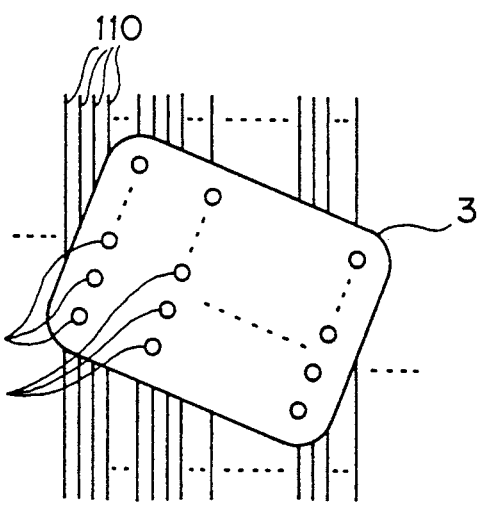

Furthermore, it is possible to arrange a plurality of microscopic electron guns and four-divided detectors to be aligned in a direction inclined with respect to the radial direction and further arranged as plural lines with fixed spaces therebetween in a direction perpendicular to the inclined direction, as shown in FIG. 6C.

In the above-described embodiments, the electron beam projecting apparatus serves as an electron beam pickup. However, it is also possible to compose the apparatus as a surface detection apparatus for detecting the surface state of the object. In such case, it makes possible to detect the reproduced signals with fine contrast corresponding to the uneven condition of the surface of the object by selecting gas pressure, distance from the surface, and electric field at detector side, etc. and controlling the detection ratio between primary electrons and secondary electrons.

In each of the previous embodiments, although the detecting part is composed of the four-divided detectors, composition of other optionally-divided detectors can be also used.

In each of the above-described embodiments, although the assembly of the differential pumping system and the microscopic electron gun are formed individual to each other, it is possible to form the differential pumping system by a manufacturing process technology for semiconductor devices on the same substrate where the microscopic electron gun is formed.

As described above, the present invention makes it possible to miniaturize the microscopic electron projection apparatus. In addition, the present invention can improve the detection accuracy because the secondary electrons amplified in the low vacuum area by the ionization of gas molecules can be detected by maintaining the area where the electron beam is projected and detected in a low vacuum condition using a simple differential pumping system.

What is claimed is:

1. An electron beam projection apparatus comprising:
   an electron injection mans for irradiating an object with an electron beam, said electron injection means comprising a substrate, a cathode formed on the substrate for emitting the electrons, a control electrode formed on the substrate via an insulation layer in a manner enclosing the cathode for accelerating the electrons, and an anode formed on the control electrode via an insulation layer in a manner enclosing the cathode for condensing the electron beam, said cathode, control electrode and anode being formed by a manufacturing process technology for semiconductor devices;
   detecting means formed on the anode via an insulation layer for detecting secondary electrons emitted from the object irradiated with said electron beam; and
   differential pumping means for producing a low vacuum condition in the space where said electron beam travels from the microscopic electron injection means to the object, said differential pumping means comprising a base, a plurality of walls protruding from said base, and a plurality of vents each formed in a concave ditch part of said plurality of walls, wherein said electron injection means is disposed on said base in a manner being enclosed by the plurality of walls.

2. The electron beam projection apparatus according to claim 1, further comprising electric field applying means for applying electric field from the object to said detector means.

3. The electron beam projection apparatus according to claim 1, wherein said detecting means comprising a plurality of detectors each formed on a flat surface.

4. The electron beam projection apparatus according to claim 1, wherein said plurality of walls are concentrically ringed cylindrical walls.

5. An electron beam projection apparatus comprising:
   a plurality of electron injection means for irradiating an object with an electron beam, said electron injection means comprising a substrate, a cathode formed on the substrate for emitting the electrons, a control electrode formed on the substrate via an insulation layer in a manner enclosing the cathode for accelerating the electrons, and an anode formed on the control electrode via an insulation layer in a manner enclosing the cathode for condensing the electron beam, said cathode, control electrode and anode being formed by a manufacturing process technology for semiconductor devices;
   a plurality of detecting means formed on the anode via an insulation layer for detecting secondary electrons emitted from the object irradiated with said electron beam; and
   differential pumping means for producing a low vacuum condition in the space where said electron beam travels from the microscopic electron injection means to the object, said differential pumping means comprising a base, a plurality of walls protruding from said base, and a plurality of vents each formed in a concave ditch part of said plurality of walls, wherein said plurality of electron injection means is disposed on said base in a manner being enclosed by the plurality of walls.

6. The electron beam projection apparatus according to claim 5, further comprising a plurality of electric field applying means for applying electric field from the object to each of said plurality of detector means.

7. The electron beam projection apparatus according to claim 5, wherein said detecting means comprising a plurality of detectors each formed on a flat surface.

8. The electron beam projection apparatus according to claim 5, wherein said plurality of walls are concentrically ringed cylindrical walls.

* * * * *